US009209304B2

(12) United States Patent
Hsiao et al.

(10) Patent No.: US 9,209,304 B2
(45) Date of Patent: Dec. 8, 2015

(54) N/P MOS FINFET PERFORMANCE ENHANCEMENT BY SPECIFIC ORIENTATION SURFACE

(71) Applicant: Taiwan Semiconductor Manufacturing Co., Ltd., Hsin-Chu (TW)

(72) Inventors: Ru-Shang Hsiao, Jhubei (TW); Hung Pin Chen, Kaohsiung (TW); Wei-Barn Chen, Tainan (TW); Chih-Fu Chang, Neipu Township (TW); Chih-Kang Chao, Tainan (TW); Ling-Sung Wang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/179,585

(22) Filed: Feb. 13, 2014

(65) Prior Publication Data
US 2015/0228794 A1    Aug. 13, 2015

(51) Int. Cl.
*H01L 29/78*    (2006.01)

(52) U.S. Cl.
CPC ........ *H01L 29/7853* (2013.01); *H01L 29/7843* (2013.01)

(58) Field of Classification Search
CPC ....... H01L 21/322; H01L 29/66; H01L 29/78; H01L 29/045; H01L 29/785; H01L 29/7853; H01L 29/1033
See application file for complete search history.

(56) References Cited

U.S. PATENT DOCUMENTS

| | | | | |
|---|---|---|---|---|
| 7,898,033 | B2* | 3/2011 | Ohmi et al. | 257/350 |
| 8,362,567 | B2* | 1/2013 | Ohmi et al. | 257/368 |
| 2004/0032003 | A1* | 2/2004 | Ohmi et al. | 257/508 |
| 2004/0108575 | A1* | 6/2004 | Ohmi et al. | 257/627 |
| 2006/0022268 | A1* | 2/2006 | Oh et al. | 257/347 |
| 2006/0138538 | A1* | 6/2006 | Ohmi et al. | 257/341 |
| 2007/0145535 | A1* | 6/2007 | Ohmi et al. | 257/618 |
| 2009/0026529 | A1* | 1/2009 | Akahori | 257/324 |
| 2009/0162995 | A1* | 6/2009 | Ohmi et al. | 438/471 |
| 2010/0090258 | A1* | 4/2010 | Takaishi | 257/255 |
| 2011/0278676 | A1* | 11/2011 | Cheng et al. | 257/369 |
| 2013/0256764 | A1* | 10/2013 | Liaw | 257/288 |
| 2014/0239354 | A1* | 8/2014 | Huang et al. | 257/288 |
| 2014/0252436 | A1* | 9/2014 | Suwa et al. | 257/288 |
| 2014/0299923 | A1* | 10/2014 | Chang | 257/288 |
| 2015/0001468 | A1* | 1/2015 | Huang et al. | 257/24 |

OTHER PUBLICATIONS

Giacomini, et al. "Non-Vertical Sidewall Angle Influence on Triple-Gate FinFET's Corner Effects." ECS Transactions, 2007, vol. 6, issue 4. Published on May 10, 2007. 2 Pages.

Illinois Institute of Technology—Academic Resource Center. "Miller Indices." Published on Jan. 16, 2013. 20 Pages.

* cited by examiner

*Primary Examiner* — Tan N Tran
*Assistant Examiner* — Fazli Erdem
(74) *Attorney, Agent, or Firm* — Eschweiler & Associates, LLC

(57) ABSTRACT

As will be appreciated in more detail herein, the present disclosure provides for FinFET techniques whereby a FinFET channel region has a particular orientation with respect to the crystalline lattice of the semiconductor device to provide enhanced mobility, compared to conventional FinFETs. In particular, the present disclosure provides FinFETs with a channel region whose lattice includes silicon atoms arranged on (551) lattice plane. In this configuration, the sidewalls of the channel region are particularly smooth at the atomic level, which tends to promote higher carrier mobility and higher device performance than previously achievable.

18 Claims, 6 Drawing Sheets

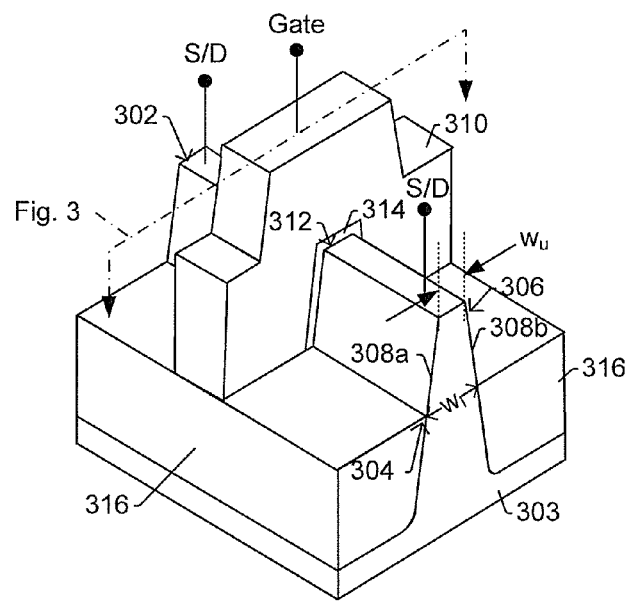
FIG. 3
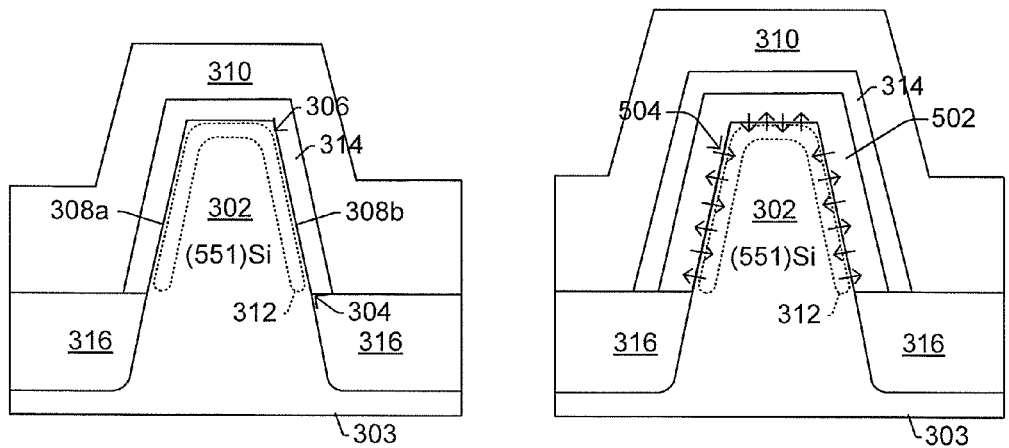
FIG. 4   FIG. 5

N/P MOS FINFET PERFORMANCE ENHANCEMENT BY SPECIFIC ORIENTATION SURFACE

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators can continue to overcome the technological challenges associated with it. In particular, one trend to increase transistor density in recent years is to go to three dimensional gates—so called "FinFETs"—which tend to improve performance compared to conventional planar device at equal power supply voltages. For example, whereas high leakage current, which can arise due to short-channel effects and varying dopant levels, is potentially threatening scaling for future generations of planar transistors; FinFETs may provide a solution that allows scaling to continue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a perspective view of a FinFET device that includes a (5 5 1) silicon channel in accordance with some embodiments.

FIG. 4 illustrates a cross-sectional view of FIG. 3's FinFET device in accordance with some embodiments.

FIG. 5 illustrates a cross-sectional view of a FinFET device where an epitaxial strain inducing layer is formed over the (5 5 1) channel region in accordance with some embodiments.

DETAILED DESCRIPTION

Figure 1:
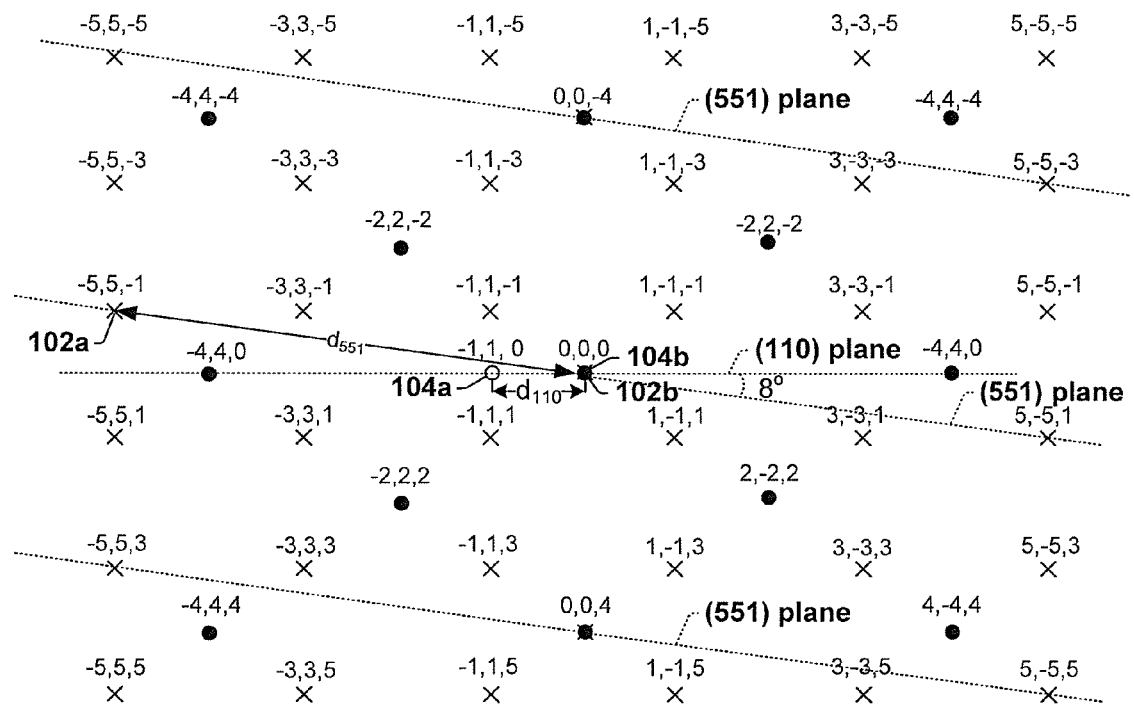
FIG. 1 illustrates a plot illustrating some embodiments of a (5 5 1) silicon lattice which can be used for a FinFET channel region in accordance with some embodiments. The plot also illustrates a (1 1 0) silicon lattice for comparison.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In solid-state physics, electron mobility characterizes how quickly an electron can move through a metal or semiconductor lattice, when pulled by an electric field. In semiconductors, there is an analogous quantity for holes, called hole mobility. The term "carrier mobility" refers in general to electron and/or hole mobility in semiconductors. For semiconductors, the behavior of transistors and other devices can be very different depending on whether the carrier mobility is high or low. Therefore mobility is a very important parameter for semiconductor materials. Almost always, higher mobility leads to better device performance, with other things equal.

As will be appreciated in more detail herein, the present disclosure provides for FinFET techniques whereby a FinFET channel region has a particular orientation with respect to the crystalline lattice of the semiconductor device to provide enhanced mobility, compared to conventional FinFETs. In particular, the present disclosure provides FinFETs with a channel region whose lattice includes silicon atoms arranged on (551) lattice plane. In this configuration, the sidewalls of the channel region are particularly smooth at the atomic level, which tends to promote higher carrier mobility and higher device performance than previously achievable.

To provide a background for this (551) orientation, a brief description of Miller indices is now provided. As appreciated by a person of ordinary skill in the art, Miller indices are a notation system in crystallography to describe planes in crystal (Bravais) lattices. In particular, a family of lattice planes is determined by three integers h, k, and l, which are collectively referred to as the Miller indices. Each index denotes a plane orthogonal to a direction (h, k, l) in the basis of reciprocal lattice vectors. By convention, the integers are usually written in lowest terms, i.e. their greatest common divisor should be 1. For example, Miller index (100) represents a plane orthogonal to direction h; index (010) represents a plane orthogonal to direction k; and index (001) represents a plane orthogonal to l. Further, (h, k, l) represents a point; [h k l] represents a direction; <h k l> represents a family of directions; (h k l) represents a plane; and {h k l} represents a family of planes.

With this background in mind, FIG. 1 shows a simulation of two different silicon lattices—namely a first silicon lattice where Si atoms (represented by "x" points, such as 102$a$, 102$b$) are bonded on (5 5 1) planes in accordance with this disclosure, and a second silicon lattice where Si atoms (represented by "dots", such as 104$a$, 104$b$) are bonded on (−1 1 0) planes for comparison. Note that in order to make the (5 5 1) lattice easier to view, not all Si atoms are shown. In comparing these two lattices, the applicants note the (5 5 1) and (1 1 0) planes are offset by an angle of 8°. This shift in bond angle for neighboring atoms results in neighboring atoms in the (551) lattice being spaced apart by distance $d_{551}$, which is further than spacing $d_{110}$ between neighboring atoms in the (1

1 0) lattice, although these inter-atomic distances $d_{551}$, $d_{110}$ can vary based on pressure, temperature and the like.

Figure 2:
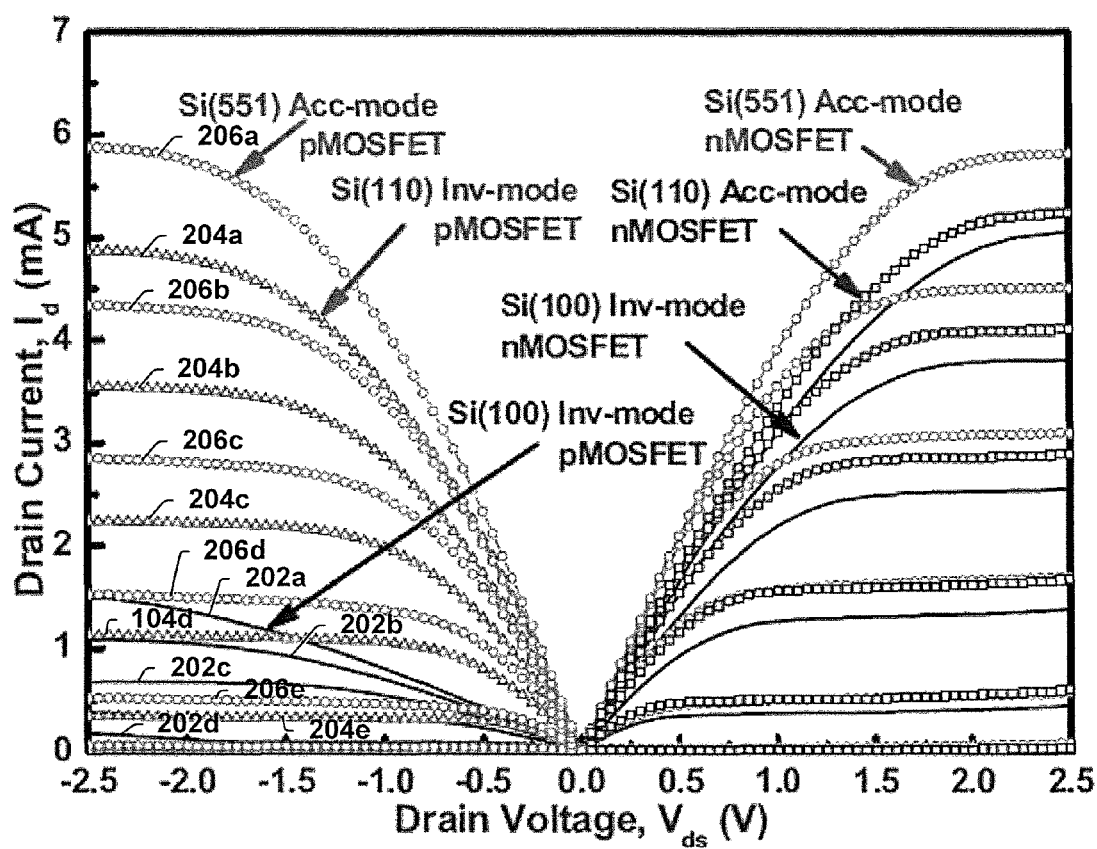
FIG. 2 illustrates a chart which sets forth IV characteristics for a number of different devices and which highlights some examples of how a (5 5 1) silicon channel region can improve device performance.

To illustrate an example of mobility enhancement that can be gained by using a channel made of semiconductor material exhibiting a (5 5 1) lattice plane, FIG. 2 shows a chart 200 that includes current-voltage curves for several devices which have different lattice structures for their channels. In particular, curves are shown for a Si(551) accumulation mode pMOSFET, a Si(110) inversion mode pMOSFET, a Si(100) inversion mode pMOSFET, a Si(551) accumulation mode nMOSFET, a Si(110) accumulation mode nMOSFET, and a Si(100) inversion mode nMOSFET. Each of these devices has the same width to length ratio (W/L=20/1), and five biases are applied to each device, namely a 0.5 V bias, a 1.0 V bias, a 1.5 V bias, a 2.0 V bias, and a 1.5 V bias, as shown by the separate curves.

Thus, a first p-type MOSFET, which operates in inversion mode and has a channel formed of material with atoms on a (1 0 0) lattice plane, has a series of IV curves 202a, 202b, 202c, 202d. A second p-type MOSFET, which operates in inversion mode and has a channel formed of material with atoms on a (1 1 0) lattice plane, has a series of IV curves 204a, 204b, 204c, 204d, 204e. A third p-type MOSFET, which operates in accumulation mode and has a channel formed of material with atoms on a (551) lattice plane, has a series of IV curves 206a, 206b, 206c, 206d, 206e. Somewhat analogous IV curves are shown for n-type MOSFET devices on the right-hand side of the chart. Notably, the devices formed with the (5 5 1) lattice plane have higher current measured at the drain for other conditions being equal. Thus, the devices having the (551) lattice plane for the channel have better performance compared to conventional devices. This improvement is likely due to the fact the (5 5 1) lattice plane has an extremely smooth surface interface for the channel region, which may enhance carrier mobility.

Table I below provides an example comparison of current drivability of inversion mode (IM) and accumulation mode (AM) n-MOSFET and p-MOSFET devices on Si(1 0 0), Si(1 1 0), and Si(5 5 1) surfaces:

TABLE I

| Current drivability of transistors | | | |
|---|---|---|---|
| | Si(100) | Si(110) | Si(551) |
| IM n-MOSFET | 5.05 | 3.86 | 4.27 |
| AM n-MOSFET | — | 5.24 | 5.81 |
| IM p-MOSFET | 1.6 | 4.86 | 5.55 |
| AM p-MOSFET | | 5.05 | 5.88 |

As can be seen from Table I, the device having Si(5 5 1) channel regions promote higher current levels than with other lattice orientations under similar bias conditions.

FIG. 3 shows a FinFET device 300 in accordance with some embodiments, which makes use of a (5 5 1) channel region. As shown in FIG. 3, the FinFET 300 includes a semiconductor fin 302 that extends upwardly from a semiconductor substrate 303. Rather than having perfectly vertical sidewalls (e.g., vertical sidewalls lying on a (1 0 0) lattice plane), fin 302 has a base fin portion 304 having a base fin width, $w_b$, and an upper fin portion 306 having an upper fin width, $w_u$. The base fin width $w_b$ is larger than the upper fin width $w_u$, such that outer fin sidewalls 308a, 308b are angled inwardly from bottom to top in some embodiments. In other embodiments, the fin sidewalls 308a, 308b are vertical rather than angled (i.e., $w_b=w_u$). A conductive gate electrode 310 straddles a channel region 312 of the fin, wherein source and drain regions (S/D) are arranged in the fin on opposite edges of the gate electrode 310. The source and drain regions (S/D) have one doping type (e.g., n-type), while the channel region 312 has an opposite doping type (e.g., p-type). A gate dielectric 314 separates the conductive gate electrode 310 from the channel region 312. A dielectric layer 316 may also extend downward under the gate electrode 310 and along sidewalls of a base portion of fin 302. The channel region 312 includes Si atoms disposed on a (5 5 1) lattice plane to enhance carrier mobility.

During operation, a gate voltage is applied to the gate electrode 310, which can cause carriers to accumulate in the channel region 312 or can cause inversion in the channel region 312, depending on the magnitude of the applied gate voltage. While the gate voltage is applied, a voltage between the source and drain regions (S/D) can be concurrently applied, which will sweep carriers between source to drain and thereby cause current to flow. Notably, compared to conventional approaches, the carriers flowing between source and drain in FIG. 3's FinFET will experience a high mobility due to the (5 5 1) lattice of the channel region 312.

FIG. 4 shows a cross-sectional view of the channel region 312 of FinFET 300. Again, the channel region 312, which is illustrated as lying along outer Si fin sidewalls 308a, 308b but whose width can vary depending on the particular implementation and bias conditions, includes Si atoms arranged on a (5 5 1) lattice plane. Because the atomic "smoothness" of the interface surface between the surface of outer fin sidewalls 308a, 308b and corresponding surface of inner sidewalls of gate dielectric 314, this configuration provides enhanced carrier mobility and enhanced performance.

FIG. 5 shows a cross-sectional view of a channel region of another FinFET 500. In this example, like FIGS. 3's embodiment, the channel region 312 still includes Si atoms arranged on a (5 5 1) lattice plane. In this embodiment, however, a strain inducing layer 502, such as an epitaxially grown Si or SiGe layer for example, is formed over the fin sidewalls 308a, 308b prior to the formation of the gate dielectric 314. Hence, in this example, the gate dielectric 314 conformally overlies the strain-inducing layer 502, and a conductive gate electrode 310 conformally overlies the gate dielectric 314. As shown by arrows 504, the strain inducing layer can impart compressive or tensile strain to the channel region 312, thereby further enhancing the carrier mobility.

Figure 6:
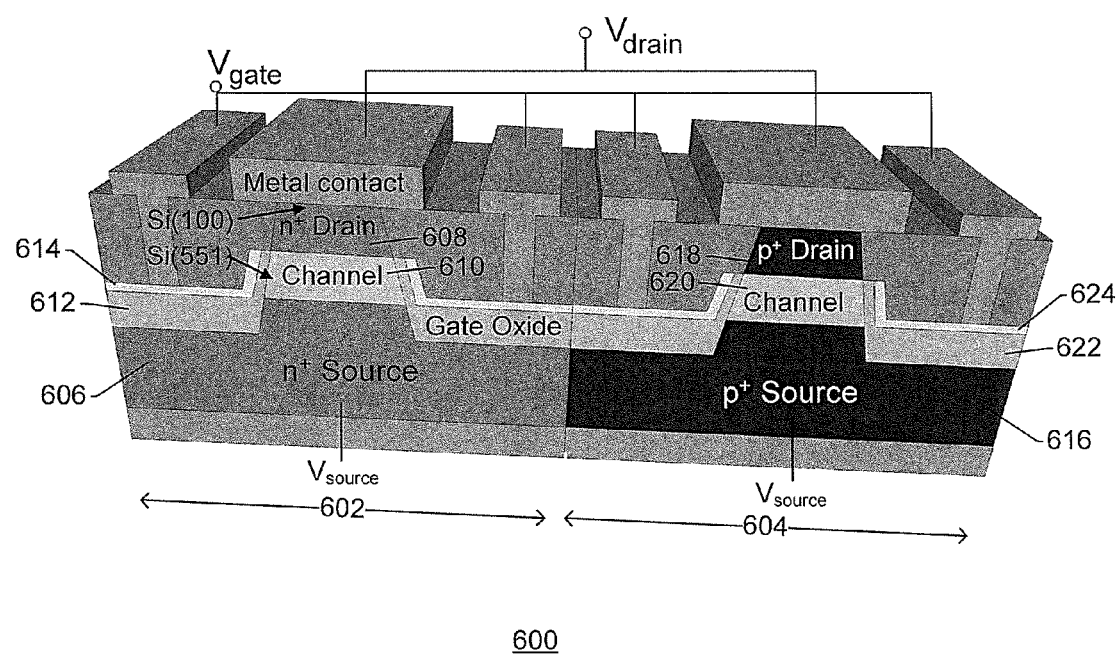
FIG. 6 illustrates a cross-sectional perspective view of a semiconductor device in accordance with some embodiments.

FIG. 6 shows another semiconductor device 600 in accordance with some embodiments and which again makes use of a (5 5 1) Si channel region. FIG. 6's device 600 includes a p-type transistor 602 and an n-type transistor 604. Whereas the transistors of FIG. 3-5 were FinFETs where current flowed horizontally through the fin, both of these transistors 602, 604 in FIG. 6 have vertical current flow through their respective fins.

In FIG. 6, the n-type transistor 602 has an N+ source region 606 in a base portion of its semiconductor fin. An N+ drain region 608 is arranged in the upper portion of its semiconductor fin. A p-type channel region 610 is arranged over the source region 606 and under the drain region 608, so as to physically separate the source and drain regions 606, 608 from one another. The source 606, drain 608 and channel region 610 have planar sidewalls, all of which are co-planar, and which are formed on a (5 5 1) lattice plane. A gate dielectric 612, such as a gate oxide, is arranged on fin sidewalls of the source 606 and channel region 610, and has an upper surface that is aligned to a junction between the drain 608 and channel region 610. A gate electrode 614 is arranged about outer sidewalls of the gate dielectric 610, and can cause carrier accumulation and/or depletion in the channel region 610 when a suitable gate voltage is applied thereto.

In FIG. 6, the p-type transistor 604 has a P+ source region 616 in a base portion of its semiconductor fin. A P+ drain region 618 is arranged in the upper portion of its semiconductor fin. An n-type channel region 620 is arranged over the source region 616 and under the drain region 618, so as to physically separate the source and drain regions 616, 618 from one another. The source 616, drain 618 and channel region 620 have planar sidewalls, all of which are co-planar, and which are formed on a (5 5 1) lattice plane. A gate dielectric 622, such as a gate oxide, is arranged on fin sidewalls of the source 616 and channel region 620, and has an upper surface that is aligned to a junction between the drain 618 and channel region 620. A gate electrode 624 is arranged about outer sidewalls of the gate dielectric 620, and can cause carrier accumulation and/or depletion in the channel region 620 when a suitable gate voltage is applied thereto.

Although FIG. 6 has been described above as having gate electrodes 614, 624, which directly overly gate dielectrics 612, 622, respectively, in other embodiments a strain-inducing layer can be arranged between the gate electrodes 614, 624 and gate dielectrics 610, 620. The (551) lattice of the channel regions 610, 620 enhances carrier mobility, and the addition of this strain-inducing layer, if present, can further enhance carrier mobility to further enhance device performance. Further, although the drains 608, 618 are shown as being coupled to a node (VDrain) and gates 614, 624 are shown as being coupled to node VGate, the drains 608, 618 and/or gates 614, 624 can also be independent of one another in other embodiments.

Figure 7:
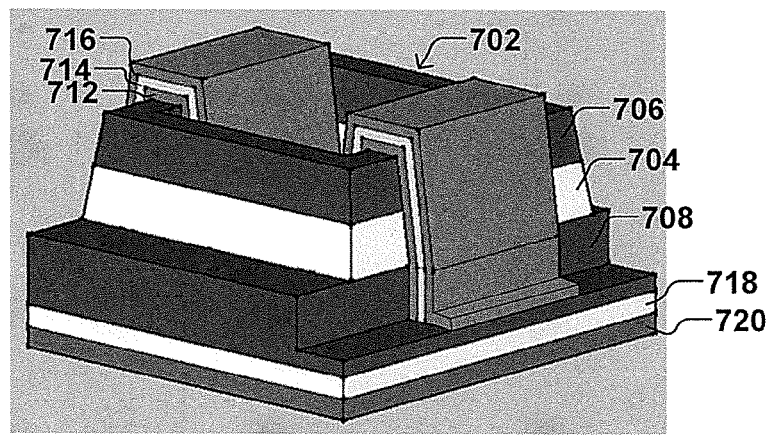
FIG. 7 illustrates a perspective view of a semiconductor device in accordance with some embodiments.
Figure 8:
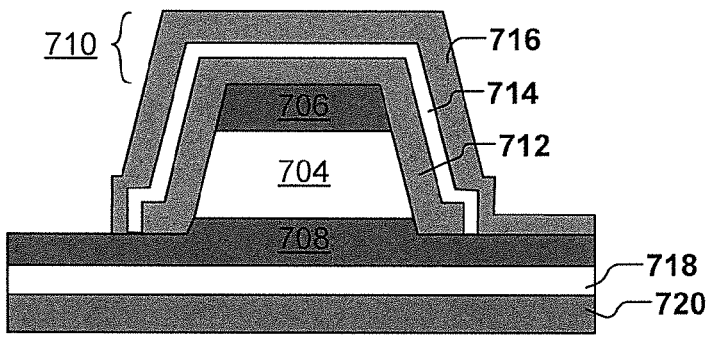
FIG. 8 illustrates a top view of FIG. 7's semiconductor device in accordance with some embodiments.
Figure 9:
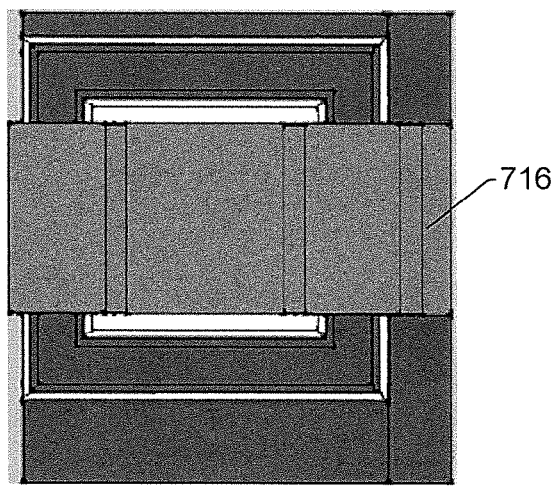
FIG. 9 illustrates a cross-sectional view of FIG. 7's semiconductor device in accordance with some embodiments.

FIG. 7-9 show another semiconductor device 700 in accordance with some embodiments and which again makes use of (5 5 1) Si fin sidewalls. In FIG. 7, a fin of the transistor device has a ring-like configuration. Within this ring-like fin 702, a channel region 704 (which can be a p-type region, for example) is arranged between an upper drain region 706 (which can correspond to an N+ polysilicon region in an upper portion of the ring) and a lower source region 708 (which can correspond to an N+ polysilicon region in a lower portion of the ring). An upper portion of the ring-like fin 702 can be narrower than a lower portion of the ring-like fin 702, such that the fin sidewalls are again angled along a (5 5 1) lattice plane, for example.

As shown in FIG. 8, a gate stack 710 can be formed over the channel region 704 of the device 700. The gate stack 710 can include a strain inducing layer 712, such as un-doped polysilicon, which extends continuously over the fin sidewalls and upper fin surface. A gate dielectric 714, such as silicon dioxide, is then formed over the strain-inducing layer 712. A conductive gate electrode 716, such as a polysilicon layer, is then formed over the gate dielectric 714. A buffer oxide 718 and substrate 720 can underlie the source region.

Figure 10:
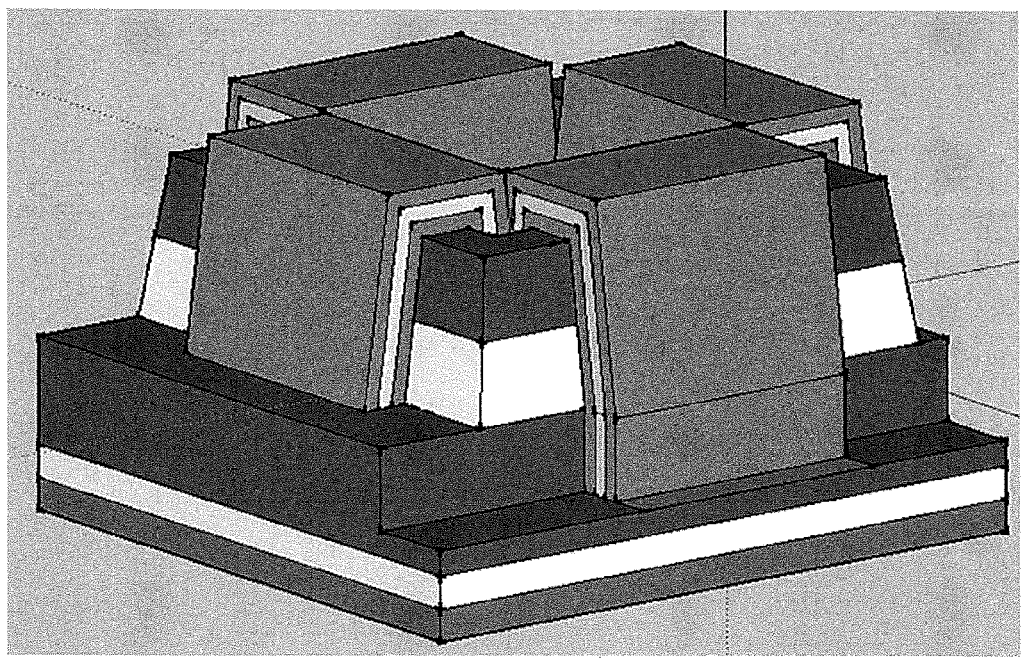
FIG. 10 illustrates a perspective view of a semiconductor device in accordance with some embodiments.

As viewed from over top (FIG. 9), the gate stack 710 extends in a linear fashion over diametrically opposed portions of the ring-like fin 712. It will be appreciated that "ring-like" structure as used in this specification does not limit the scope of this disclosure in any way, and that the term "ring-like" is intended to encompass structures that are square (e.g., as illustrated in FIGS. 7-9), square-like, rectangular, otherwise polygonal, circular, or elliptical. Further, although the term "diametrically opposed" can in connotations imply a circle or sphere, in the present application it is not so limited and is be interpreted as meaning at opposite sides of the ring-like structure. Thus, even if the ring-like structure is a square or rectangle, for example, the gate stack 710 still extends over diametrically opposed (i.e., opposite) sides of the structure. In addition, even though some embodiments may exhibit a gate that extends over diametrically opposed portions of the ring-like structure which are 180° offset from one another relative to a central point of the structure, in other embodiments the gate stack 710 may extend over portions of the ring which are less than 180° offset from each other. For example, the gate stack could make a 90° turn at a center portion of the ring-like structure, rather than then extending in linear fashion as in the illustrated embodiment. Further still, in other embodiments, the gate stack could extend over a significant portion of the top surface and sidewalls, for example, as shown in FIG. 10. Further still, in other embodiments, the gate stack could cover the entire top surface and sidewalls of a ring-like fin in all directions, thereby providing a larger channel region to deliver more current between source and drain when the FinFET is on.

As can be appreciated above, the present disclosure provides FinFETs with a channel region whose lattice includes silicon atoms arranged on (551) lattice plane. In this configuration, the sidewalls of the channel region are particularly smooth at the atomic level, which tends to promote higher carrier mobility and higher device performance than previously achievable.

Some embodiments relate to an integrated circuit. The integrated circuit includes a fin of semiconductor material having a base fin portion having a base fin width, an upper fin portion having an upper fin width, and outer fin sidewalls extending upwardly from the base fin portion to the upper fin portion, wherein a first outer sidewall of the fin is disposed on a (551) lattice plane.

Other embodiments relate to an integrated circuit that includes a fin of semiconductor material, wherein an outer sidewall of the fin is disposed on a (551) lattice plane. The fin includes a base fin portion having a base fin width, an upper fin portion having an upper fin width, and outer fin sidewalls extending upwardly from the base fin portion to the upper fin portion. A first source/drain region is disposed in the upper portion of the fin, and a second source/drain region is disposed in the lower portion of the fin. A channel region separates the first source/drain region from the second source/drain region. A conductive gate electrode is formed about outer sidewalls of the channel region and is separated from the channel region by a gate dielectric.

Still other embodiments relate to an integrated circuit that includes a ring-like fin of semiconductor material. The integrated circuit includes a base fin portion having a base fin width and an upper fin portion having an upper fin width. Planar outer fin sidewalls extend upwardly from the base fin portion to the upper fin portion. A first source/drain region is disposed in the base fin portion, and a second source/drain region is disposed in the upper fin portion. A channel region, which has silicon atoms arranged in a (551) silicon lattice, is arranged in the ring-like fin between the first and second source/drain regions. A conductive gate electrode extends over the ring-like fin so as to pass over diametrically opposed portions of the ring-like fin. A gate dielectric separates the conductive gate electrode from the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
 a fin of semiconductor material having a base fin portion having a base fin width, an upper fin portion having an upper fin width, and outer fin sidewalls extending upwardly from the base fin portion to the upper fin portion, wherein an outer sidewall of the fin is disposed on a (551) lattice plane,
 a conductive gate electrode straddling a channel region of the fin and having a gate dielectric separating the conductive gate electrode from the channel region;
 source and drain regions disposed in the fin on opposite edges of the conductive gate electrode; and
 an undoped polysilicon region extending continuously over the outer fin sidewall and the upper fin portion, wherein the undoped polysilicon region is sandwiched between the outer fin sidewall and the gate dielectric.

2. The integrated circuit of claim 1, wherein the upper fin width is less than the base fin width.

3. The integrated circuit of claim 1, wherein the undoped polysilicon region, in extending continuously over the outer fin sidewall, abuts outer sidewalls of each of the channel region and the source and drain regions.

4. The integrated circuit of claim 1,
 wherein the conductive electrode is arranged along sidewalls of the channel region and has an upper conductive electrode surface that is aligned with a junction between the drain region and the channel region.

5. The integrated circuit of claim 4, wherein the first source and drain regions and the channel region are arranged over one another to form a ring-like structure as viewed from above.

6. The integrated circuit of claim 5, wherein, as viewed from above, the conductive gate electrode extends in a linear fashion over diametrically opposed portions of the ring-like structure.

7. An integrated circuit, comprising:
 a ring-shaped fin of semiconductor material having a base fin portion having a base fin width, an upper fin portion having an upper fin width, and outer fin sidewalls extending upwardly from the base fin portion to the upper fin portion, wherein an outer sidewall of the fin is disposed on a (551) lattice plane;
 a first source/drain region disposed in the upper portion of the fin;
 a second source/drain region disposed in the base portion of the fin, wherein a channel region separates the first source/drain region from the second source/drain region; and
 a conductive gate electrode disposed along outer sidewalls of the ring-shaped fin and extending downwardly along inner sidewalls of the ring-shaped fin adjacent to the channel region and separated from the channel region by a gate dielectric.

8. The integrated circuit of claim 7, wherein outer sidewalls of the first source/drain region, outer sidewalls of the channel region, and outer sidewalls of the second source/drain region are all co-planar.

9. The integrated circuit of claim 8, wherein the gate dielectric has an upper surface that is aligned with a junction interface at which the first source/drain region abuts the channel region.

10. The integrated circuit of claim 7, wherein, as viewed from above, the conductive gate electrode extends in a linear fashion over diametrically opposed portions of the ring-shaped fin.

11. The integrated circuit of claim 7, further comprising:
 a strain-inducing layer sandwiched between the conductive gate electrode and the gate dielectric.

12. An integrated circuit, comprising:
 a ring-shaped fin of semiconductor material including a ring-shaped base fin portion having a base fin thickness and a ring-shaped upper fin portion having an upper fin thickness, wherein inner and outer planar fin sidewalls extend upwardly from the base fin portion to the upper fin portion;
 a first source/drain region disposed in the base fin portion;
 a second source/drain region disposed in the upper fin portion, wherein a channel region having silicon atoms arranged in a (551) silicon lattice is arranged in the ring-shaped fin between the first and second source/drain regions;
 a ring-shaped conductive gate electrode extending over the ring-shaped fin so as to extend along the inner and outer planar fin sidewalls at diametrically opposed portions of the ring-shaped fin; wherein a gate dielectric separates the conductive gate electrode from the channel region.

13. The integrated circuit of claim 12, further comprising:
 a strain-inducing layer sandwiched between the conductive gate electrode and the gate dielectric.

14. The integrated circuit of claim 12, further comprising:
 an undoped polysilicon region extending continuously over the inner and outer planar sidewalls of the ring-shaped fin and over the upper fin portion, wherein the undoped polysilicon region separates the ring-shaped fin and the gate dielectric.

15. The integrated circuit of claim 12, wherein the gate dielectric has an upper surface that is aligned with a junction interface at which the first source/drain region abuts the channel region.

16. The integrated circuit of claim 12, wherein, as viewed from above, the conductive gate electrode extends in a linear fashion over the diametrically opposed portions of the ring-shaped fin.

17. The integrated circuit of claim 12, wherein the upper fin thickness is less than the base fin thickness.

18. The integrated circuit of claim 8, wherein the upper fin width is less than the base fin width.

* * * * *